(12) United States Patent
Huang et al.

(10) Patent No.: US 6,778,054 B1
(45) Date of Patent: Aug. 17, 2004

(54) METHODS AND APPARATUS FOR PASSIVE SHIMMING OF MAGNETS

(75) Inventors: Xianrui Huang, Clifton Park, NY (US); Bruce Campbell Amm, Clifton, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/678,330

(22) Filed: Oct. 3, 2003

(51) Int. Cl.⁷ .................................................. G01V 3/00
(52) U.S. Cl. ...................... 335/301; 335/297; 324/320
(58) Field of Search ........................ 335/216, 296–306; 324/318–320

(56) References Cited

U.S. PATENT DOCUMENTS

| | | | |
|---|---|---|---|
| 5,089,798 A | * | 2/1992 | Miyata ........................ 335/211 |
| 5,378,989 A | | 1/1995 | Barber et al. |
| 5,864,275 A | * | 1/1999 | Ohashi et al. .............. 335/306 |
| 5,973,582 A | | 10/1999 | Havens et al. |
| 5,999,076 A | | 12/1999 | Becker, Jr. et al. |
| 6,014,069 A | | 1/2000 | Havens et al. |
| 6,181,137 B1 | | 1/2001 | Havens et al. |
| 6,566,991 B1 | * | 5/2003 | Rimkunas et al. .......... 335/301 |
| 2003/0079334 A1 | | 5/2003 | Xu et al. |

* cited by examiner

Primary Examiner—Ramon M. Barrera
(74) Attorney, Agent, or Firm—Jean K. Testa; Patrick K. Patnode (57) ABSTRACT

A method for shimming a magnetic field of a magnet in a volume of interest, utilizing ferromagnetic pellets for shimming. The pellets are positioned in a nonmagnetic holder having a predetermined number of pellet holes. The method includes measuring the magnetic field of a magnet in a plurality of locations within the volume of interest, determining a nominal passive shimming mass to compensate the measured magnetic field to approximate a desired magnetic field within the volume of interest; and placing a combination of ferromagnetic pellets from a selection of full strength pellets, nearly full strength pellets, and low strength pellets in the pellet holes to approximate the nominal passive shimming mass.

20 Claims, 4 Drawing Sheets

METHODS AND APPARATUS FOR PASSIVE SHIMMING OF MAGNETS

BACKGROUND OF THE INVENTION

This invention relates generally to methods and apparatus for passively shimming a magnet to correct deviations from a desired magnetic field. Methods and apparatus of the present invention are particularly useful in conjunction with magnetic resonance imaging (MRI) apparatus for correcting magnetic field inhomogeneities resulting from manufacturing tolerances. Although the examples cited herein involve MRI apparatus and superconducting magnets, the usefulness of the invention is not limited solely to such apparatus or magnets.

A high uniform magnetic field is useful for using magnetic resonance image (MRI) and nuclear magnetic resonance (NMR) systems as a medical device or a chemical/biological device. At least some popular MRI systems currently available utilize a superconducting magnet that creates a field uniform in a z-direction of about 0.7 Tesla to about 1.5 Tesla in a pre-determined space (i.e., an imaging volume, or volume of interest).

Some types of materials can be made superconducting by placement in an extremely cold environment, such as a cryostat or pressure vessel containing cryogenic material. In the case of a magnet coil, such as those used in MRI apparatus, extreme cold is used to make magnet coils superconducting. In such a state, an initial current produced in the coil continues to flow even after power is removed. Superconducting magnets find wide application in the field of MRI due to their high magnetic field strength.

For proper operation of known MRI apparatus, the magnetic field of the magnet must be uniform in the z-direction to within a specified tolerance, often about 10 ppm. To compensate for inhomogeneities, MRI magnets, including superconducting magnets, are often shimmed utilizing various arrangements of correction coils and/or passive ferromagnetic shim materials.

Open architecture MRI magnets are not immune to field inhomogeneity due to coil deformation and coil misalignment. Known superconducting magnet designs have been directed at minimizing such inhomogeneity during the design stage. To remove inhomogeneity that remains after the manufacturing cycle due to manufacturing tolerances, environmental effects, and/or design restrictions, passive shim systems have been used.

Various shimming methods for MRI magnets are known. At least one known method utilizes a combination of correction coils and passive ferromagnetic shims. The superconducting magnet is adjusted at the factory utilizing these coils and shims to provide a homogeneous magnetic field in the imaging bore of the magnet, which is also referred to herein as a "volume of interest." Passive shims are positioned between a warm imaging bore and a gradient coil. As a result, in known MRI systems, it is difficult to access and adjust or change passive shims after the gradient coil is installed while minimizing the profile or space occupied by the shim assembly. However, due to magnetic material in the vicinity of the magnet at the installation site, it is frequently necessary to reshim the magnet to provide a specified field homogeneity.

Known passive shimming systems are difficult to adjust on-site. Thus, on-site adjustment has frequently been limited to varying the current through the correction coils. However, it is expensive to provide correction coils, associated circuitry and leads for this purpose.

Figure 1:
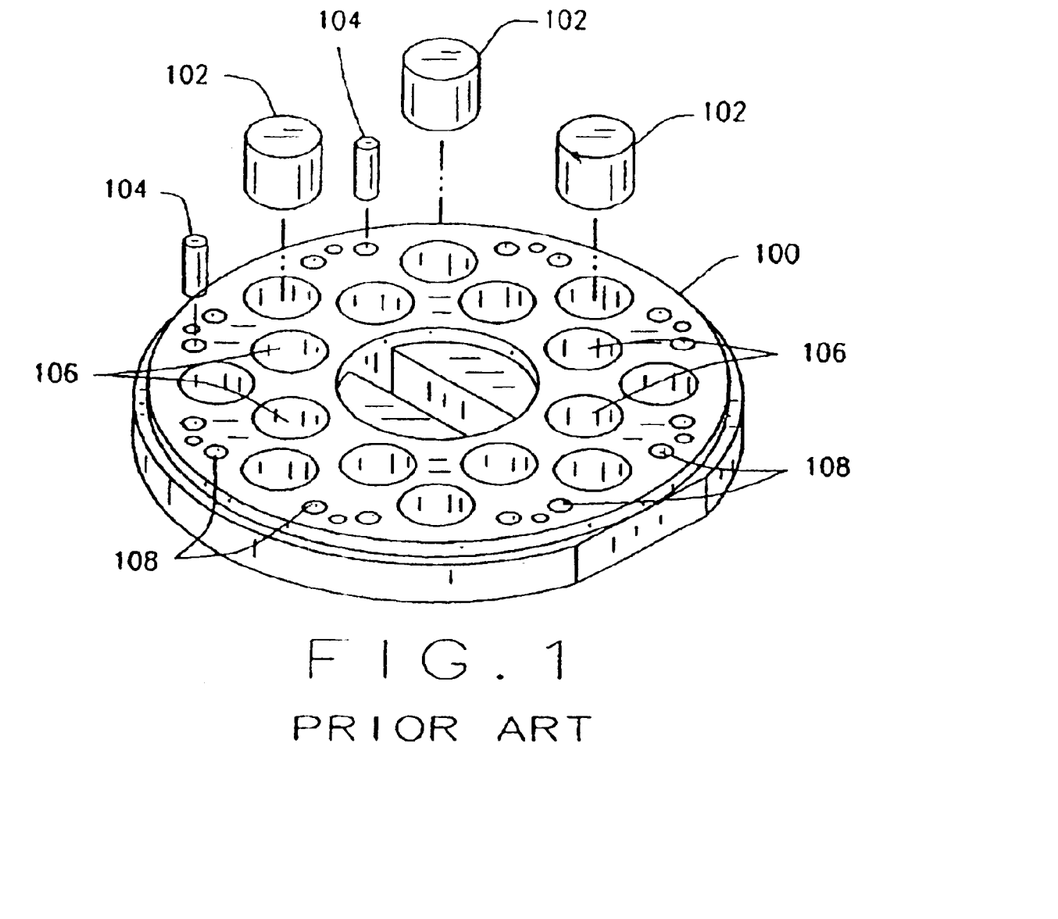
FIG. 1 is a drawing of prior art nonmagnetic shim disks or holders and the ferromagnetic pellets that are used therein to shim a magnet to compensate for inhomogeneities of the magnetic field of at least one known MRI apparatus configuration.
Figure 2:
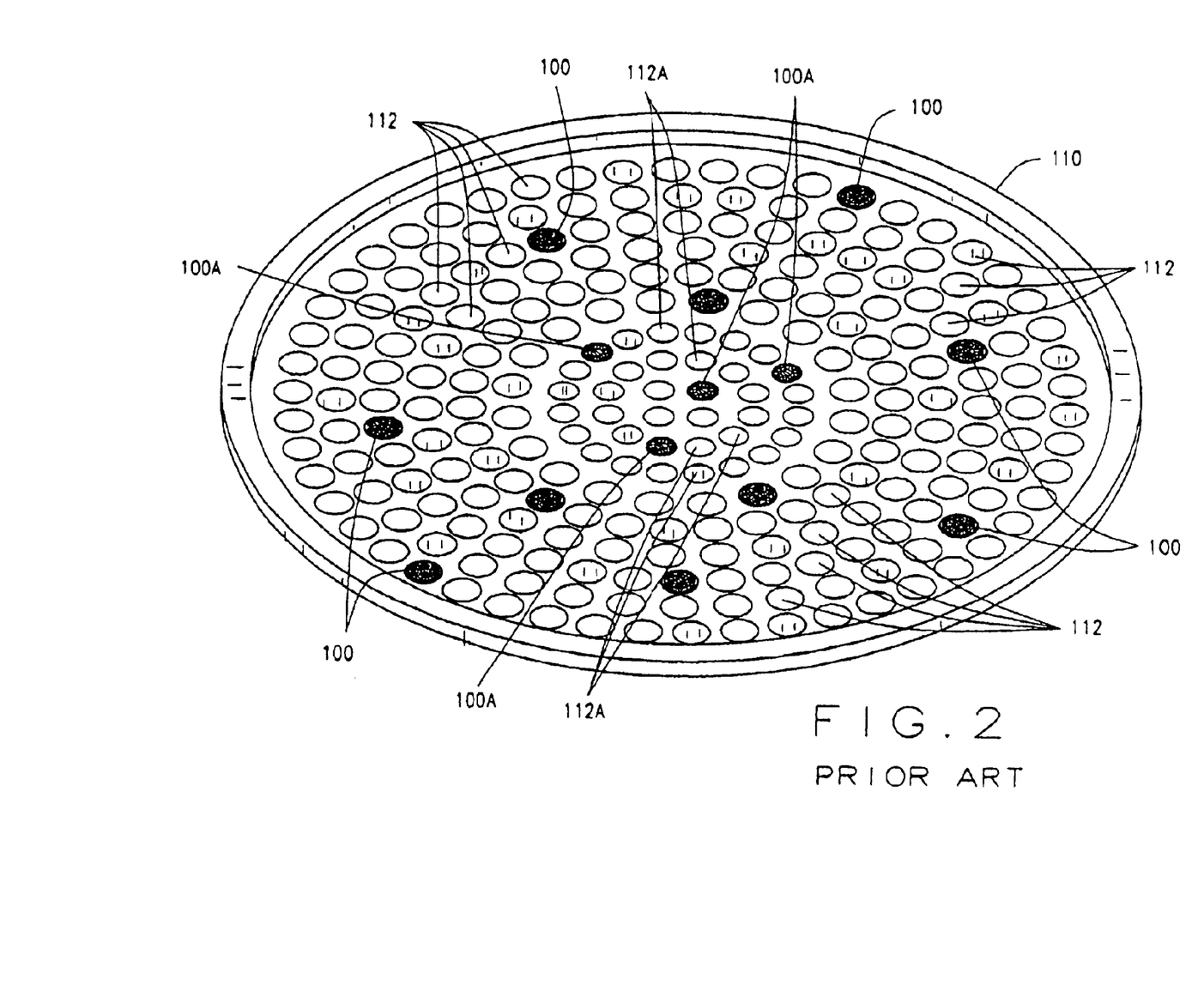
FIG. 2 is a drawing of prior art shim disk mounting hardware suitable for use with shim disks or holders illustrated in FIG. 1. This or a similar shim disk mounting hardware configuration is also suitable for use with FIG. 3 is a drawing representative of various configurations of an MRI apparatus of the present invention.

Referring to FIGS. 1 and 2, at least one known MRI configuration provides passive shimming for a superconducting magnet utilizing a plurality of plastic disks 100 that serve as nonmagnetic pellet holders for pellets 102, 104. Each pellet holder 100 has a number of preformed round holes 106, 108 into which a cylindrical or disk-shaped ferromagnetic pellet 102 or 104, respectively, can be placed. Known configurations utilize two different size holes 106 and 108, each size corresponding to one of two different masses 102 and 104 of ferromagnetic pellet. As many pellets 102 and 104 are inserted into each pellet holder 100 as is required to compensate for inhomogeneities in a magnetic field of the MRI magnet. Pellet holders 100 are held in place in the magnetic field of an MRI magnet utilizing pellet holder mounting hardware 110, wherein a pellet holder 100 is inserted into as many mounting positions 112 of mounting hardware 110 as is required for the desired shimming.

Although effective, known passive shimming systems are subject to various limitations. For example, manufacturing and maintaining two different sizes of shim masses is costly. Moreover, accurate shimming often requires iteration due to manufacturing variations other variables. Convergence of this process can be also slowed as known iterative shimming methods replace one or more pellet-containing holders with holders containing different pellets to compensate for residual magnetic field inhomogeneities. Note, too, that holes 106 and 108 correspond in size, respectively, to the different sizes of pellets 102 and 104. Thus, it is not possible to place a pellet having a large mass into a hole corresponding to a pellet having a smaller mass. This difference in pellet sizes limits the range of compensation that is possible within each pellet holder 110.

BRIEF DESCRIPTION OF THE INVENTION

Some configurations of the present invention therefore provide a method for shimming a magnetic field of a magnet in a volume of interest, utilizing ferromagnetic pellets for shimming. The pellets are positioned in a nonmagnetic holder having a predetermined number of pellet holes. The method includes measuring the magnetic field of a magnet in a plurality of locations within the volume of interest, determining a nominal passive shimming mass to compensate the measured magnetic field to approximate a desired magnetic field within the volume of interest; and placing a combination of ferromagnetic pellets from a selection of full strength pellets, nearly full strength pellets, and low strength pellets in the pellet holes to approximate the nominal passive shimming mass.

In some configurations, a shimming set having exactly three strengths of ferromagnetic pellets is provided. The shimming set includes full strength pellets, nearly full strength pellets, and low strength pellets. Also included is a nonmagnetic holder configured to hold a fixed number of pellets. A pellet combination selector aid is provided to facilitate selection of a combination of pellets that approximates a desired total mass and that does not exceed the fixed number of pellets.

A method for shimming a magnetic field of a magnet of an MRI apparatus within an imaging volume is provided in some configurations. The magnet is configured to utilize, for shimming, ferromagnetic pellets positioned in a nonmagnetic holder having a predetermined number of pellet holes. The method includes: measuring the magnetic field of the magnet in a plurality of locations within the imaging volume. A nominal passive shimming mass to compensate the measured magnetic field to approximate a desired magnetic field within the imaging volume is determined. A combination of ferromagnetic pellets from a selection of full strength pellets, nearly full strength pellets, and low strength pellets is placed in the pellet holes to approximate the nominal passive shimming mass.

Some configurations of the present invention provide an MRI apparatus that includes a superconducting magnet having a magnetic field shimmed to an approximation of a uniform magnetic field within a volume of interest utilizing exactly three different strengths of ferromagnetic pellets.

Some configurations of the present invention provide a kit of sintered shimming pellets consisting of a plurality of pellets having exactly three different strengths. The provided strengths are full strength, nearly full strength, and low strength. The different strength pellets are of equal size, and pellets of different strengths include different percentage mixtures of iron powder and plastic powder.

Various configurations of the present invention will be seen to reduce shimming quantization errors in comparison to errors usually obtained when utilizing only full strength and low strength pellets for shimming. Also, various configurations of the present invention produce more accurately shimmed magnetic fields and faster convergence when iterative shimming methods are used. In addition, manufacturing and inventory costs are reduced in many configurations as a result of the need to produce and stock only three types of shims.

BRIEF DESCRIPTION OF THE DRAWINGS

The figures are not necessarily drawn to scale.

DETAILED DESCRIPTION OF THE INVENTION

Figure 3:
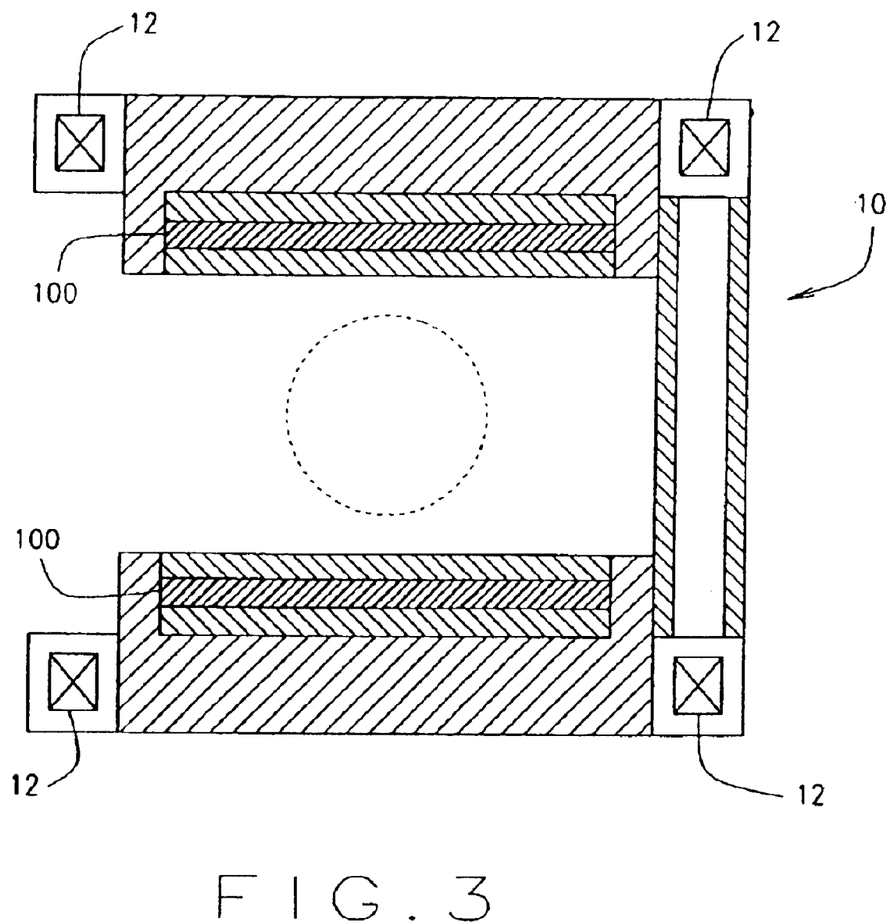
Figure 4:
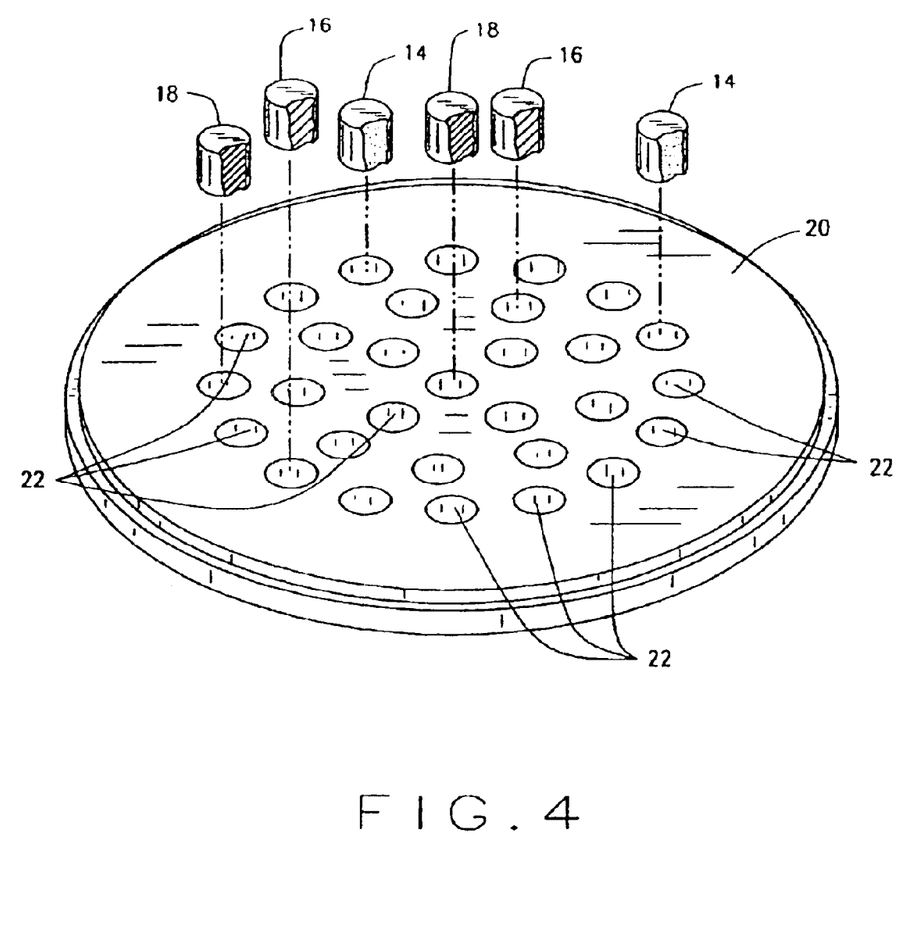
FIG. 4 is a drawing representative of various configurations of a shim disk or pellet holder and ferromagnetic pellets of the present invention.

In various configurations of the present invention and referring to FIGS. 3 and 4, a magnet 12, for example, a magnet of an MRI apparatus 10, is passively shimmed utilizing a set of three different strengths of ferromagnetic pellets 14, 16, and 18. ("Strength," as used herein, refers to relative ferromagnetic mass.) For example, ferromagnetic pellets 14, 16, and 18 can be sintered pellets made by die compression of a mixture of uniformly mixed ferromagnetic and nonmagnetic material, such as iron and plastic. This mixture can be compressed to a uniform cylindrical shape of 2 mm long by 1 mm in diameter for fitting into a nonmagnetic holder 20. Nonmagnetic holders 20 are used to hold zero or more pellets 14, 16, and/or 18 to produce a shimming mass in all or a subset of holes or pellet positions 22. The total number of holes 22 in a holder 20 is a fixed number, for example, thirty. Not all holes 22 are required to be filled with a pellet, as the number of and types of pellets are determined from shimming requirements. Nonmagnetic holders 20, including whatever mass of shimming pellets is determined to be necessary at each location, are placed as needed in specified locations to compensate the magnetic field of magnet 12. For example, in an MRI apparatus 10, nonmagnetic holders 20, each with some combination of pellet types 14, 16, and/or 18 may be placed in one or more a mounting positions 112 of mounting hardware 100 of FIG. 2.

The mass of ferromagnetic material in pellets 14, 16, and 18 is selected so that pellets 16 are nearly full strength and pellets 18 are low strength in relation to full strength pellets 14. Full strength pellets 14 are considered to be 100% strength, and contain a mass unit of ferromagnetic material such as iron. Nearly full strength pellets 16 and low strength pellets 18 contain less ferromagnetic mass, as is described in more detail below. It is assumed herein that the ferromagnetic material in each pellet is the same. If the ferromagnetic material is different, the relative strengths may be different than their ferromagnetic mass content, depending upon the magnetic field change induced per unit weight of each type of material.

In some configurations, nonmagnetic holders 20 are plastic disks having holes 21 configured to receive no more than a fixed number of pellets, for example, 30 (thirty) pellets. In some MRI configurations, nonmagnetic holders 20 fit into mounting positions 112 of mounting hardware 110, similar to that shown in FIG. 1. Mounting hardware 110 locks nonmagnetic holders 20 rigidly in place in MRI apparatus 10 in a location in which pellets in holders 20 affect the magnetic field of MRI magnet 12 within a volume of interest 24. In various configurations, nonmagnetic holders 20 can also be unlocked from mounting hardware 110. A holder 20 unlocked from a mounting position 112 can, in some configurations, have its pellet 14, 16, 18 load changed before replacement in mounting position 112, possibly retaining one or more pellets from a previous load. Also in some configurations, a holder 20 can be replaced by another holder 20 with a different pellet 14, 16, 18 load.

In some configurations of the present invention, a magnetic field of a magnet such as magnet 12 is measured in a plurality of locations within a volume of interest 24. A field camera or magnetometer probe can be used for this purpose. For example, superconducting coil 12 of MRI apparatus 10 is characterized by a theoretical magnetic field based upon its design. This theoretical or "design" field is intended to be as uniform as possible within an imaging volume 24, say to within 10 ppm, but is not perfect. (For example, fringing fields contribute to nonuniformity.) Manufacturing variations and environmental factors introduce additional nonuniformity into the magnetic field that must be compensated in order to closely approximate the design field. To effect this compensation (i.e., "shimming"), measurements of the magnetic field of magnet 12 are taken at a plurality of points (e.g., 500 points) within three-dimensional volume 24, or within one or more slices of that volume. These measurements are used to determine a nominal shimming weights at each location 112 to compensate for manufacturing and environmental variations. The nominal shimming weights are those that would result in an approximation of a desired magnetic field within volume of interest 24. In the case of an MRI magnet 12, the desired magnetic field is most often the design field, but it is not so limited by the invention.

In various configurations of the present invention, shimming is performed by placing ferromagnetic pellets at prescribed positions near magnet 12. A combination of zero or more pellets 14, 16, and/or 18 are placed in nonmagnetic holders 20, which in turn are locked in place in particular positions 112 in mounting hardware 110 inside MRI apparatus 10. The number and combination of pellets 14, 16, and 18 in each holder 20 and the mounting positions 112 in which each holder 20 is placed is dependent upon the amount and location of the compensation to be applied. "A combination of zero or more pellets 14, 16, and/or 18," as used herein, means zero or more full strength pellets 14, zero or more nearly full strength pellets 16, and zero or more low strength pellets 18.

More particularly, any suitable known computational algorithm is utilized to determine a ferromagnetic compensating mass for each position 112. This determination can be made without regard for the quantization of mass due to the utilization of only three discrete strengths of pellets 14, 16, and 18. If the determination is so made, the ferromagnetic compensating mass is referred to herein synonymously as a "continuous shimming solution" or as a "nominal passive shimming mass."

From the continuous shimming solution, a combination of ferromagnetic pellets 14, 16, and 18 is determined for placement in nonmagnetic holders 20 at locations 112. These determined combinations approximate the nominal passive shimming mass at each location 112.

In some configurations, full strength pellets 14 are 2 mm tall by 1 mm diameter sintered cylindrical masses comprising iron powder. In some configurations, full strength pellets 14 comprise a solid ferromagnetic mass. In other configurations, the sintered masses may also include zero or greater percentage of nonmagnetic material such as plastic powder to achieve a predetermined unit ferromagnetic mass per pellet 14.

Low strength pellets 18 contain only a small amount of ferromagnetic material in comparison to full strength pellets 14. For example, low strength pellets 18 are the same size or substantially the same size as full strength pellets 14, but contain a substantially larger percentage of plastic power and a much smaller percentage of iron powder. Similarly, nearly full strength pellets 16 are the same size or substantially the same size as full strength pellets 18, but contain a slightly larger percentage of plastic powder and a slightly smaller percentage of iron powder. In some configurations, low strength pellets 18 contain only 6% of the iron mass of full strength pellets 14, and nearly full strength pellets contain 95% of the iron mass of full strength pellets 14.

In some configurations, nearly full strength pellets 16 contain the same composition as full strength pellets 14 but are slightly smaller. For example, nearly full strength pellets 16 may be 5% shorter than full strength pellets 14. However, manufacturing economies are achieved by having pellets 14, 16, and 18 the same size, with differences only in composition.

Nominal strengths of full strength pellets 14, nearly full strength pellets 16 and low strength pellets 18 are determined in accordance with manufacturing tolerances of magnet 12 and the size and number of pellet positions or holes 22 in holder 20. More particularly, a maximum mass per holder 20 is determined in accordance with manufacturing tolerances of MRI apparatus 10 and magnet 12. If the maximum ferromagnetic mass per holder 20 needed to compensate for manufacturing tolerances is m and the number of holes 22 in a holder 20 is N, the ferromagnetic mass in a full strength pellet is m/N.

The nominal strength of low strength pellets 18 is determined according to the minimum mass correction step that is required. For example, a correction step of 4 ppm may be required to ensure that MRI apparatus 10 achieves magnetic field uniformity within an advertised specification. In this case, a single low strength pellet 18 should produce a change of 4 ppm or less in the magnetic field uniformity. For example, low strength pellets 18 having 6% of the strength of a full strength pellet 14 produce a sufficiently small change in some configurations of MRI apparatus 10.

There are a limited number of pellet holes 22 in a holder 20 (e.g., thirty). The difference between the greatest possible ferromagnetic mass in a holder 20 and the second greatest mass that can be achieved with only full strength pellets 14 and low strength pellets 18 is equal to the difference in ferromagnetic mass between these two types of pellets. Generally, this difference is greater than or much greater than the minimum mass correction step determined above. Thus, in various configurations of the present invention, nearly full strength pellets 16 are also provided. Nearly full strength pellets 16 have a ferromagnetic mass such that the mass difference between a full strength pellet 14 and a nearly full strength pellet 16 produces no more than the minimum mass correction step determined above. The number of holes 22 in holder 20 should be sufficient to allow the minimum mass correction step to be achieved with different combinations of ferromagnetic pellets 14, 16, and 18, given their strength differences. For example, some configuration have thirty pellet holes 22 per holder 20, full strength pellets of 100% strength, nearly full strength pellets 16 of 95% strength and low strength pellets 18 of 6% strength. By selecting a strength for nearly full strength pellets 16 that differs from full strength pellets 14 by an amount different than the strength of low strength pellets 18, a greater number of different masses can be achieved by different pellet combinations than would otherwise be the case.

Although configurations utilizing more than three different nominal pellet strengths are possible, such configurations are not required when the above rules for selecting pellet strengths are followed. The use of only three pellet strengths reduces manufacturing costs and complexity. In addition, the complexity of the passive shimming process itself is also simplified due to the limited number of different pellet strengths and pellet combinations that must be stocked, handled, and taken into consideration for shimming calculations.

The size and physical strength of holder 20 and the size of pellets 14, 16, and 18 should also be taken into consideration in the placement of holes 22 in the design of holders 20.

A combination of full strength pellets 14, nearly full strength pellets 16, and low strength pellets 18 is determined that approximates the continuous shimming solution mass. Some configurations utilize a pellet combination selector aid to facilitate selection of a pellet combination approximating a total mass and yet which does not exceed the fixed number of pellet holes in a nonmagnetic holder, computer or processor to determine this combination. The pellet combination selector aid can be a program comprising machine readable instructions. The program is configured to instruct a computer to select a combination of pellets that approximates the determined continuous shimming solution mass. For example, the program can perform a lookup in a precomputed table (such as Table I) stored in a memory.

A computer or processor is not required to select pellet combinations in all configurations of the present invention. Manual calculation may suffice. In some configurations, a table listing the one or more combinations of pellets corresponding to each of a plurality of different of masses is provided as a pellet combination selector aid. For convenience, the table can be sorted in order of either increasing or decreasing strength. Exemplary portions of a table applicable to a configuration having 6% strength, 95% strength, and 100% strength pellets appear in Table I below. Rows in the table corresponding to entries used in the examples that follow Table I are printed in bold italic solely for the convenience of the reader in locating those entries.

TABLE I

| Total Strength | Full Strength (100%) Pellets | Nearly Full Strength (95%) Pellets | Low Strength (6%) Pellets |
|---|---|---|---|
| ... | ... | ... | ... |
| 29.55 | 21 | 9 | 0 |
| 29.50 | 20 | 10 | 0 |
| 29.45 | 19 | 11 | 0 |
| 29.40 | 18 | 12 | 0 |
| 29.35 | 17 | 13 | 0 |
| 29.30 | 16 | 14 | 0 |
| 29.25 | 15 | 15 | 0 |
| 29.20 | 14 | 16 | 0 |
| 29.15 | 13 | 17 | 0 |
| 29.10 | 12 | 18 | 0 |
| 29.06 | 29 | 0 | 1 |
| 29.05 | 11 | 19 | 0 |
| 29.01 | 28 | 1 | 1 |
| 29.00 | 29 | 0 | 0 |
| 29.00 | 10 | 20 | 0 |
| 28.96 | 27 | 2 | 1 |
| 28.95 | 28 | 1 | 0 |
| 28.95 | 9 | 21 | 0 |
| ... | ... | ... | ... |
| 24.22 | 7 | 18 | 2 |
| 24.21 | 8 | 17 | 1 |
| 24.21 | 21 | 3 | 6 |
| 24.20 | 9 | 16 | 0 |
| 24.20 | 22 | 2 | 5 |
| 24.20 | 3 | 22 | 5 |
| 24.19 | 23 | 1 | 14 |
| 24.19 | 4 | 21 | 4 |
| 24.18 | 24 | 0 | 3 |
| 24.18 | 5 | 20 | 3 |
| 24.17 | 6 | 19 | 2 |
| 24.16 | 7 | 18 | 1 |
| 24.16 | 20 | 4 | 6 |
| 24.15 | 8 | 17 | 0 |
| 24.15 | 21 | 3 | 5 |
| 24.15 | 2 | 23 | 5 |
| 24.14 | 22 | 2 | 4 |
| 24.14 | 3 | 22 | 4 |
| 24.13 | 23 | 1 | 3 |
| 24.13 | 4 | 21 | 3 |
| 24.12 | 24 | 0 | 2 |
| 24.12 | 5 | 20 | 2 |
| 24.11 | 6 | 19 | 1 |
| 24.11 | 19 | 5 | 6 |
| 24.10 | 7 | 18 | 0 |
| 24.10 | 20 | 4 | 5 |
| 24.10 | 1 | 24 | 5 |
| 24.09 | 21 | 3 | 4 |
| 24.09 | 2 | 23 | 4 |
| 24.08 | 22 | 2 | 3 |
| 24.08 | 3 | 22 | 3 |
| ... | ... | ... | ... |
| 24.00 | 24 | 0 | 0 |
| 24.00 | 5 | 20 | 0 |
| 24.00 | 18 | 6 | 5 |
| 23.99 | 19 | 5 | 4 |
| 23.99 | 0 | 25 | 4 |
| 23.98 | 20 | 4 | 3 |
| 23.98 | 1 | 24 | 3 |
| 23.97 | 21 | 3 | 2 |
| 23.97 | 2 | 23 | 2 |
| 23.96 | 22 | 2 | 1 |
| 23.96 | 3 | 22 | 1 |
| 23.96 | 16 | 8 | 6 |
| 23.95 | 23 | 1 | 0 |
| 23.95 | 4 | 21 | 0 |
| 23.95 | 17 | 7 | 5 |

TABLE I-continued

| Total Strength | Full Strength (100%) Pellets | Nearly Full Strength (95%) Pellets | Low Strength (6%) Pellets |
|---|---|---|---|
| 23.94 | 18 | 6 | 4 |
| 23.93 | 19 | 5 | 3 |
| 23.93 | 0 | 25 | 3 |
| 23.92 | 20 | 4 | 2 |
| 23.92 | 1 | 24 | 2 |
| 23.91 | 21 | 3 | 1 |
| 23.91 | 2 | 23 | 1 |
| 23.91 | 15 | 9 | 6 |
| 23.90 | 22 | 2 | 0 |
| 23.90 | 3 | 22 | 0 |
| 23.90 | 16 | 8 | 5 |
| ... | ... | ... | ... |

Omitted portions of the table above are indicated by " . . . ". The total number of rows in the complete table is equal to the total number of distinct combinations of three types of pellets 14, 16, and 18 in which the total number of pellets is less than or equal to the number of holes in the nonmagnetic holder. For n holes, this number is $$\sum_{i=0}^{n}(i+1)(i+2)=5456, \text{ for } n=30.$$

One method for computing a complete version of the above table involves filling an array s[4,5456] in a manner such that, for each i, s[2,i], s[3,i], and s[4,i] contain the number of pellets of full strength, nearly full strength, and low strength in a different distinct combination of 30 or fewer total pellets. Next, set s[1,i] equal to the total strength of the combination, i.e., s[1,i]=s[2,i]+0.95*s[3,i]+0.06*s[4,i] in the case of 100%, 95% and 6% pellet strengths. The four element vectors s[1,i],s[2,i],s[3,i],s[4,i] are then sorted in numerical order according to increasing or decreasing strengths. Once the vectors are so arranged, vectors representing equal strengths can be further sorted in order of the total number of pellets that are required to form the combination, i.e., s[2,i]+s[3,i]+s[4,i]. The above table is sorted in order of decreasing total strength first, and then in order of increasing total number of pellets within each collection of identical strengths. This sorting order makes it easy to locate a specific strength or the nearest possible strength that can be produced by the three different strengths of pellets. It also makes it easy to locate the combination requiring the minimum number of pellets to produce that strength.

The error reduction that can occur in configurations of the present invention through the use of nearly full strength pellets can be quite substantial. Errors of about 0.5 units of mass (wherein 1 unit mass=1 full strength pellet) can be reduced to less than about 0.03 units in some configurations. For example, if the total number of pellets is 30 and the continuous shim solution asks for 29.52 unit of mass, quantized pellet solutions are as follows:

TABLE II

|  | without 95% pellets | with 95% pellets |
|---|---|---|
| Number of 100% pellets | 29 | 20 |
| Number of 6% pellets | 1 | 0 |

TABLE II-continued

|  | without 95% pellets | with 95% pellets |
|---|---|---|
| Number of 95% pellets | 0 | 10 |
| quantized mass | 29.06 | 29.50 |
| error | 0.46 | 0.02 |

Nominal pellet strengths as manufactured actually represent mean pellet strengths for the corresponding pellet type. For example, 100%, 95% and 6% represent mean relative strengths of the three types of pellets in some configurations. Each type of pellet 14, 16, and 18 is also characterized by a standard deviation due to manufacturing tolerances. If the pellets have large standard deviations, the quantization error introduced by a shimming correction will be correspondingly larger than anticipated from consideration of only the mean pellet strengths. The variations of the pellets, together with other errors, limit the final shimmed homogeneity and slow down the shimming convergence, especially in the last iterations in some configurations in which further adjustments are made to correct for residual deviations from the desired magnetic field. However, some configurations of the present invention substantially avoid this limitation and speed shimming convergence utilizing a pellet combination adjustment rather than a pellet combination replacement strategy.

More particularly, after a first compensation of the magnetic field is performed, the magnetic field is remeasured in a plurality of locations within the volume of interest. The remeasurement is used to determine any residual deviation from the desired magnetic field. From the determined residual variation, a continuous shimming mass change (which is also synonymously referred to herein as a nominal shimming mass change) is determined for compensate for the residual deviation. This nominal shimming mass change is approximated by making a discrete change utilizing full strength pellets 14, nearly full strength pellets 16, and low strength pellets 18. In some configurations, all the pellets in the original combination of pellets with a different combination of pellets containing different pellets selected from the same three strengths. For example, a first pellet holder 20 used in the previous compensation can be replaced with a second pellet holder 20 in which the pellets in the first pellet holder are not reused. For notational convenience, methods utilizing this configuration are classed in a category referred to herein as "Method I." Another configuration that effects the discrete change in mass reuses at least one of the pellets in the original combination, up to as many pellets as possible, and replaces, removes, or adds other pellets. For example, a pellet holder used in the previous compensation can be removed and a new combination of pellets in accordance with the determined shimming weight change is produced. At least one pellet from the previous combination is reused. Some configurations reuse as many pellets as possible to create the new combination. Configuration that reuse one or more pellets in a changed combination are said to "adjust the combination the pellets" and are classed into a category referred to herein as "Method II." The new combinations of Method II can be placed in either the old pellet holder 20 or a new pellet holder 20. For notational convenience, both cases are said herein to "adjust the combination of pellets in the holder," even if the adjusted combination is placed in a new pellet holder. Either Method I or Method II configurations can be repeated until convergence is obtained to within a specified accuracy, which may be limited by manufacturing tolerances of magnet 10 or pellets 14, 16, and/or 18.

Due to manufacturing tolerances, it is reasonable to assume that the strength of any pellet selected from a group of pellets of the same nominal strength is a random variable having as its mean the nominal strength of pellets of that type. Thus, in some configurations, depending upon the pellet type, the mean of the random variable is either 1.00, 0.95, or 0.06 units for full strength, nearly full strength, or low strength pellets, respectively. The random variable also has a variance associated with it, e.g., $\sigma_{full}^2$, $\sigma_{nearlyfull}^2$, and $\sigma_{low}^2$. The variance of the strength of a pellet combination is equal to the sum of the variances of the individual pellets, and the standard deviation is the square root of the variance. Similarly, the variance of a change in strength between two completely separate combinations of pellets 14, 16, and 18 (i.e., each combination using completely different pellets, albeit all selected from the same three types) is equal to the sum of the variances of the two combinations. As a result, Method I may produce substantial errors due to the large resulting variance. These errors may overcome the effect of the desired strength change or at least slow the expected convergence to the desired magnetic field.

On the other hand, Method II results in a smaller variance around the desired strength change. In this case, the resulting variance of the strength change is equal to the sum of the variances of only the pellets that were removed from the old combination and those that are new to the new combination.

For either Method I or Method II, the combination of pellets 14, 16, and 18 required to compensate for the determined shimming mass change is selected to have a total strength that approximates the desired shimming mass change. Sometimes, a combination of pellets can be found that produces exactly the desired shimming weight change. Other times, no such combination exists, and the indicated change must be approximated. See, for example, Table I above.

Even when a shimming mass change can be exactly produced by a combination of pellets of the three available pellet strengths, some configurations of the present invention can select a shimming mass different than that indicated by the change in some cases. In particular, some configurations of the present invention do not minimize $|\mu-\Delta M|$, where $\mu$ is a mean actual mass change resulting from the changed combination of pellets and $\Delta M$ is the nominal shimming mass change. Instead, some configurations seek to minimize the value of $|\mu-\Delta M|+\alpha\sigma$, where $\alpha$ is a weighting factor and $\sigma$ is a standard deviation of the mean actual mass change. Note that $\sigma$ is dependent only upon the standard deviation of pellets that differ between the unchanged and the changed pellet combination, and not on those that are retained. More particularly, rather than finding the closest match to the indicated weight in the table, a mass is located that is nearly the same, but which requires a smaller number of changes to the combination of pellets. The parameter $\alpha$ is sufficiently greater than zero to allow weights other than the closest matching weight to be found in some instances. Otherwise, it can be left as a design choice. A selection $\alpha=1$ has been found to be satisfactory for configurations such as those described in detail herein.

The following table illustrates configurations that seek to minimize the value of $|\mu-\Delta M|+\alpha\sigma$. Assume the standard deviation of pellets is 1% of the shim mass (0.01 unit for full strength pellets, 0.0095 unit for 95% pellets and 0.0006 unit for low strength pellets) and the continuous solution in the next shimming iteration requires a mass change of $\Delta M=0.21$ unit. A new combination of pellets is determined in some configurations by minimizing $|\mu-\Delta M|$, yielding a new combination A of pellets. The mean shimming mass change is exactly 0.21 unit, as requested by the continuous solution. However, the standard deviation is 0.23 unit, so large shimming mass errors can potentially be added by this set. On the other hand, configurations that minimize $|\mu-\Delta M|+\alpha\sigma$ yield a new combination B of pellets. Its mean shimming mass change is 0.22 unit. However, the standard deviation is only 0.03 unit, so set B is preferable to set A.

TABLE III

|  | Original pellet set | New set A | New set B |
|---|---|---|---|
| Full strength (100%) | 22 | 6 | 24 |
| 95% strength | 2 | 19 | 0 |
| Low strength (6%) | 1 | 2 | 3 |
| Mass (unit) | 23.96 | 24.17 | 24.18 |
| $|\mu-\Delta M|$ |  | 0 | 0.01 |

As a result of selecting a change in accordance with minimizing $|\mu-\Delta M|+\alpha\sigma$, compensation accuracy is increased, at least on a statistical basis, as is speed of convergence onto the intended solution.

It will thus be appreciated that configurations of the present invention provide low-cost, highly accurate passive shimming of magnets, including superconducting magnets utilized in MRI devices. In addition, quantization errors are reduced those usually obtained in configurations utilizing only two pellet strengths, whereas manufacturing is simplified by requiring only three pellet strengths to be produced. Moreover, the three pellet strengths can be produced in pellets of equal size, thereby simplifying their manufacture.

It will be understood that many configurations utilize a plurality of nonmagnetic holders 20 for shimming a magnet, each with a particular combination of zero or more pellet types 14, 16, and/or 18 and numbers of pellets. A configuration that utilizes a plurality of nonmagnetic holders is considered to fall within the scope of a configuration said to utilize "a" nonmagnetic holder, unless the recitation of the configuration is expressly limited to only one such holder (e.g., "only one nonmagnetic holder" or "no more than one nonmagnetic holder"), While the invention has been described in terms of various specific embodiments, those skilled in the art will recognize that the invention can be practiced with modification within the spirit and scope of the claims.

What is claimed is:

1. A method for shimming a magnetic field of a magnet in a volume of interest, wherein the magnet is configured to utilize, for shimming, ferromagnetic pellets positioned in a nonmagnetic holder having a predetermined number of pellet holes, said method comprising:

measuring the magnetic field of a magnet in a plurality of locations within the volume of interest;

determining a nominal passive shimming mass to compensate the measured magnetic field to approximate a desired magnetic field within the volume of interest; and placing a combination of ferromagnetic pellets from a selection of fill strength pellets, nearly full strength pellets, and low strength pellets in the pellet holes to approximate the nominal passive shimming mass.

2. The method of claim 1 wherein the nearly full strength pellets are nominally about 95% of the strength of the full strength pellets and the low strength pellets are nominally about 6% of the strength of the full strength pellets.

3. A method in accordance with claim 1 wherein said placing a combination of ferromagnetic pellets from a selection of full strength, nearly full strength, and low strength pellets in the pellet holes further comprises placing the holder into mounting hardware in an apparatus to effect the shimming of the magnetic field.

4. A method in accordance with claim 3 further comprising:

remeasuring the magnetic field of the magnet in a plurality of locations within the volume of interest to determine a residual deviation from the desired magnetic field;

determining a nominal shimming mass change to compensate for the residual deviation; and adjusting the combination of pellets in the holder in accordance with an approximation of the nominal shimming mass change.

5. A method in accordance with claim 4 wherein said full strength pellets have a mean strength and standard deviation about said full strength, said nearly full strength pellets have a mean strength and standard deviation about said nearly full strength, and said low strength pellets have a mean strength and standard deviation about said low strength, and wherein said adjusting the combination of pellets in the holder in accordance with an approximation of the determined nominal shimming mass change comprises minimizing $|\mu-\Delta M|+\alpha\sigma$, where:

$\mu$ is a mean actual mass change resulting from the adjusted combination of pellets, $\Delta M$ is the nominal shimming mass change, $\alpha$ is a weighting factor, and $\sigma$ is a standard deviation of the actual mean mass change.

6. A method in accordance with claim 4 wherein said remeasuring the magnetic field, determining the nominal shimming mass change, and adjusting the combination of pellets are performed more than once to further reduce a measure of the residual deviation from the desired magnetic field.

7. A method in accordance with claim 6 wherein said said adjusting the combination of pellets in the holder in accordance with an approximation of the determined nominal shimming mass change comprises minimizing $|\mu-\Delta M|+\alpha\sigma$, where:

$\mu$ is a mean actual mass change resulting from the adjusted combination of pellets, $\Delta M$ is the nominal shimming mass change, $\alpha$ is a weighting factor, and $\sigma$ is a standard deviation of the actual mean mass change.

8. A shimming set having exactly three strengths of ferromagnetic pellets including full strength pellets, nearly full strength pellets, and low strength pellets, a nonmagnetic holder configured to hold a fixed number of said pellets, and a pellet combination selector aid to facilitate selection of a combination of said pellets not exceeding said fixed number of pellets and which approximates a desired total mass.

9. A shimming set in accordance with claim 8 wherein said pellet combination selection means comprises machine readable instructions configured to instruct a computer to select said combination of said pellets not exceeding said fixed number in accordance with said desired total mass.

10. A shimming set in accordance with claim 8 wherein said pellet combination selection means comprises a table listing one or more combinations of pellets corresponding to a plurality of strengths, and wherein said strengths are sorted in numerical order.

11. A shimming set in accordance with claim 8 wherein the nearly full strength pellets are nominally about 95% of the strength of the full strength pellets and the low strength pellets are nominally about 6% of the strength of the full strength pellets.

12. A method for shimming, within an imaging volume, a magnetic field of a magnet of an MRI apparatus, wherein the magnet is configured to utilize, for shimming, ferromagnetic pellets positioned in a nonmagnetic holder having a predetermined number of pellet holes, said method comprising:
   measuring the magnetic field of the magnet in a plurality of locations within the imaging volume;
   determining a nominal passive shimming mass to compensate the measured magnetic field to approximate a desired magnetic field within the imaging volume; and
   placing a combination of ferromagnetic pellets from a selection of full strength pellets, nearly full strength pellets, and low strength pellets in the pellet holes to approximate the nominal passive shimming mass.

13. The method of claim 12 wherein the nearly full strength pellets are nominally about 95% of the strength of the full strength pellets and the low strength pellets are nominally about 6% of the strength of the full strength pellets.

14. A method in accordance with claim 12 wherein said placing a combination of ferromagnetic pellets from a selection of full strength, nearly full strength, and low strength pellets in the pellet holes further comprises placing the holder into a position to effect the shimming of the magnetic field.

15. A method in accordance with claim 14 further comprising:
   remeasuring the magnetic field of the magnet in a plurality of locations within the imaging volume to determine a residual deviation from the desired magnetic field;
   determining a nominal shimming mass change required to compensate for the residual deviation; and
   adjusting the combination of pellets in the holder in accordance with an approximation of the nominal shimming mass change.

16. A method in accordance with claim 15 wherein said full strength pellets have a mean strength and standard deviation about said full strength, said nearly full strength pellets have a mean strength and standard deviation about said nearly full strength, and said low strength pellets have a mean strength and standard deviation about said low strength,
   and wherein said adjusting the combination of pellets in the holder in accordance with an approximation of the determined nominal shimming mass change comprises minimizing $|\mu-\Delta M|+\alpha\sigma$, where:
   $\mu$ is a mean actual mass change resulting from the adjusted combination of pellets,
   $\Delta M$ is the nominal shimming mass change,
   $\alpha$ is a weighting factor, and
   $\sigma$ is a standard deviation of the actual mean mass change.

17. A method in accordance with claim 15 wherein said remeasuring the magnetic field, determining the nominal shimming mass change, and adjusting the combination of pellets are performed more than once to further reduce a measure of the residual deviation from the desired magnetic field.

18. A method in accordance with claim 17 wherein said adjusting the combination of pellets in the holder in accordance with an approximation of the determined nominal shimming mass change comprises
   comprises minimizing $|\mu-\Delta M|+\alpha\sigma$, where:
   $\mu$ is a mean actual mass change resulting from the adjusted combination of pellets,
   $\Delta M$ is the nominal shimming mass change,
   $\alpha$ is a weighting factor, and
   $\sigma$ is a standard deviation of the actual mean mass change.

19. An MRI apparatus comprising a superconducting magnet having a magnetic field shimmed to an approximation of a uniform magnetic field within a volume of interest utilizing exactly three different strengths of ferromagnetic pellets.

20. A kit of sintered shimming pellets consisting of a plurality of pellets having exactly three different strengths, wherein said strengths are full strength, nearly full strength, and low strength, wherein said different strength pellets are of equal size, and pellets of different strengths comprise different percentage mixtures of iron powder and plastic powder.

* * * * *